US007012956B1

(12) United States Patent
Thomsen et al.

(10) Patent No.: US 7,012,956 B1
(45) Date of Patent: Mar. 14, 2006

(54) CIRCUIT FOR OPTIMIZING A DELAY LINE USED TO DE-SKEW RECEIVED DATA SIGNALS RELATIVE TO A RECEIVED CLOCK SIGNAL

(75) Inventors: Peter M. Thomsen, Austin, TX (US); Robert J. Reese, Austin, TX (US); Hector Saenz, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/055,835

(22) Filed: Feb. 11, 2005

(51) Int. Cl.
*H04B 17/00* (2006.01)

(52) U.S. Cl. ...................................... 375/224; 375/354
(58) Field of Classification Search ................ 375/224, 375/225, 354, 355; 324/76.35; 377/76; 327/101, 136, 261, 263; 713/400, 401, 502, 713/503, 600; 702/85, 89
See application file for complete search history.

(56) References Cited

U.S. PATENT DOCUMENTS

| 6,600,681 | B1 * | 7/2003 | Korger et al. | 365/193 |
|---|---|---|---|---|
| 6,889,334 | B1 * | 5/2005 | Magro et al. | 713/500 |
| 2004/0239388 | A1 * | 12/2004 | Lee | 327/158 |
| 2005/0099210 | A1 * | 5/2005 | Fetzer et al. | 327/101 |

* cited by examiner

*Primary Examiner*—Don N. Vo
(74) *Attorney, Agent, or Firm*—Richard F. Frankeny; Winstead Sechrest & Minick P.C.; Casimer K. Salys (57) ABSTRACT

Delay circuits have programmable delay elements to delay data signals so a clock samples the data signals in the middle of the eye window pattern. The clock is frequency divided by two, generating a divided clock coupled to a clock delay circuit and a data delay circuit generating a toggle clock and a delayed toggle clock that are sampled with the clock signal. A state machine varies the number N of delay elements selected in the data delay circuit until successive samples of the toggle clock and the delay toggle clock have opposite logic stages. The resulting number N is the number of delay elements required to generate a delay equal to one period of the clock. The delay of each delay element is adjusted using adjustment control signals until an N is generated that is within a predetermined range. The adjustment control signals are distributed to the data delay circuits.

20 Claims, 9 Drawing Sheets

CIRCUIT FOR OPTIMIZING A DELAY LINE USED TO DE-SKEW RECEIVED DATA SIGNALS RELATIVE TO A RECEIVED CLOCK SIGNAL

TECHNICAL FIELD

The present invention relates in general to board level transmission line drivers and receivers, and in particular, to receiver circuits for de-skewing data signals relative to a clock signal used to sample the data signals.

BACKGROUND INFORMATION

Digital computer systems have a history of continually increasing the speed of the processors used in the system. As computer systems have migrated towards multiprocessor systems, sharing information between processors and memory systems has also generated a requirement for increased speed for the off-chip communication networks. Designers usually have more control over on-chip communication paths than for off-chip communication paths. Off-chip communication paths are longer, have higher noise, impedance mismatches, and have more discontinuities than on-chip communication paths. Since off-chip communication paths are of lower impedance, they require more current and thus more power to drive.

When using inter-chip high-speed signaling, noise and coupling between signal lines (crosstalk) affects signal quality. One way to alleviate the detrimental effects of noise and coupling is through the use of differential signaling. Differential signaling comprises sending a signal and its complement to a differential receiver. In this manner, noise and coupling affect both the signal and the complement equally. The differential receiver only senses the difference between the signal and its complement as the noise and coupling represent common mode signals. Therefore, differential signaling is resistant to the effects that noise and crosstalk have on signal quality. On the negative side, differential signaling increases pin count by a factor of two for each data line. The next best thing to differential signaling is pseudo-differential signaling. Pseudo-differential signaling comprises comparing a data signal to a reference voltage using a differential receiver or comparator.

When high speed data is transmitted between chips, the signal lines are characterized by their transmission line parameters. High speed signals are subject to reflections if the transmission lines are not terminated in an impedance that matches the transmission line characteristic impedance. Reflections may propagate back and forth between driver and receiver and reduce the margins when detecting signals at the receiver. Some form of termination is therefore usually required for all high-speed signals to control overshoot, undershoot, and increase signal quality. Typically, a Thevenin's resistance (equivalent resistance of the Thevenin's network equals characteristic impedance of transmission line) is used to terminate data lines allowing the use of higher valued resistors. Additionally, the Thevenin's network is used to establish a bias voltage between the power supply rails. In this configuration, the data signals will then swing around this Thevenin's equivalent bias voltage. When this method is used to terminate data signal lines, a reference voltage is necessary to bias a differential receiver that operates as a pseudo-differential receiver to detect data signals in the presence of noise and crosstalk.

The logic levels of driver side signals are determined by the positive and ground voltage potentials of the driver power supply. If the driver power supply has voltage variations that are unregulated, then the logic one and logic zero levels of the driver side signals will undergo similar variations. If the receiver is substantially remote from the driver such that its power supply voltage may undergo different variations from the driver side power supply, then additional variations will be added to any signal received in a receiver side terminator (e.g., Thevenin's network). These power supply variations will reduce noise margins if the reference has variations different from those on the received signals caused by the driver and receiver side power supply variations.

The popular technique of source-synchronous clocking is often used for high speed interface systems. With this technique, the transmitting device sends a clock with the data. The advantage of this approach is that the maximum performance is no longer computed form the clock-to-output delay, propagation delay, and set up times of the devices and the circuit board. Instead, the maximum performance is related to the maximum edge rate of the driver and the skew between the data signals and the clock signals. Using this technique, data may be transferred at a 1 Gbps rate (1-nsec bit period) even though the propagation delay from transmitter to receiver may exceed one nanosecond. If standard double-data rate (DDR) driving is utilized, data is launched on both the rising and falling edges of the clock. In this case, duty cycle symmetry of the clock as detected at the receiver becomes important since each edge of the clock is also used to recover the data at the receiving end of the data path. If the clock is asymmetrical, then it will affect the eye pattern of the data signals that the clock is used to detect.

As the frequency of the data and clock signals increase, the amount of skew between the data signals and the clock signal in a clock group becomes important. The delay of the transmission path may be several clock cycles. To accurately detect data and to align all of the data signals before sending to core logic in a receiving chip, the data signals are delayed relative to the clock until an optimum sampling time is achieved. This is ideally in the middle of the eye window of the data signals. Since the data signals are sampled with a clock, the amount of delay in the delay line in the data paths is relative to the clock signal. If environmental factors cause the delay of the delay line to vary, then accurately sampling the clock may be compromised or may cause errors.

There is, therefore, a need for circuitry to determine if the delay line has a predetermined delay range relative to the clock period and to adjust the delay increments of the delay line to keep the delay within the predetermined delay range.

SUMMARY OF THE INVENTION

The data path of each data bit in a clock group used to communicate between a transmitting chip and a receiving chip has delay lines that are used to de-skew the data bits at the receiver side. These delay lines are used to de-skew the data and to determine the margins that a clock sampling point has before failures would occur. These delay lines have multiple stages with taps where the total delay depends on the delay of each stage. The delay lines are configured with inverting logic stages used for each delay tap. These inverting logic stages have selectable current sources that provide current for transitioning between logic ones and logic zeroes. The selected current source value determines the transition delay for each stage and thus the value of each delay tap. At the frequency of operation, the delay lines are essentially analog circuits and thus are variable with environmental and process parameters (e.g., voltage, temperature, etc.). To assure the delays always have adequate range, they are programmable with the selectable current sources.

Since aligning the data paths requires delaying the data relative to the group clock used to sample the data, the amount of delay is relative to the clock period. By using the clock period as the measure, delay lines (like the delay lines in the data path) are measured to determine their delay relative to the clock period. The control signals are varied to select current source values so the delay lines have an adequate delay corresponding to a pre-determined percentage of the clock period. The same control signals are then used to select the current source values used in the delay lines in the data path, thereby assuring that the delay lines have adequate delay range to properly align the data paths in the clock group. Since all the delay lines are on the same integrated circuit chip and made at the same time, then common control signals settings may be used for all the delay lines.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 1:
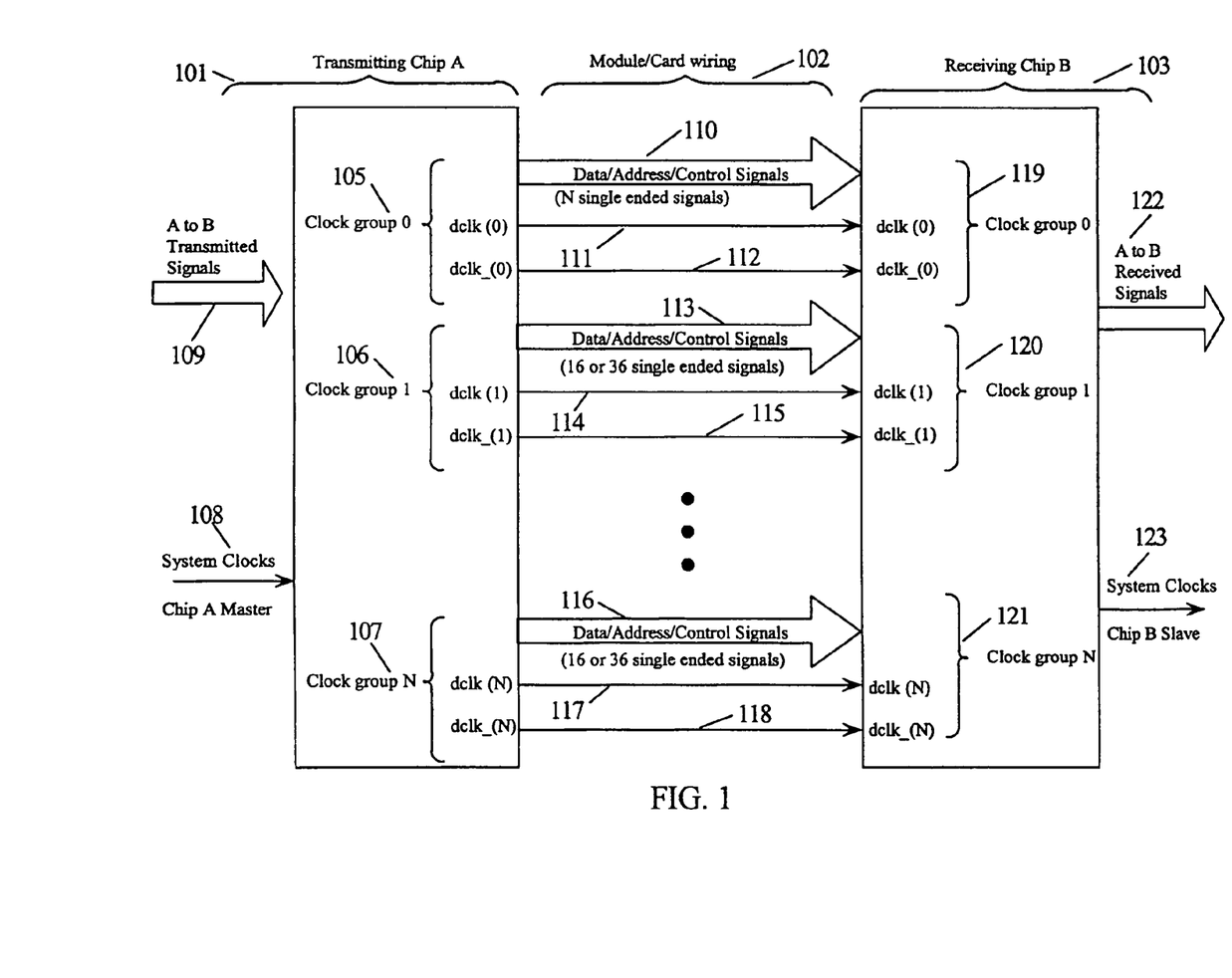
FIG. 1 is a block diagram of signal and clock distributions in clock groups according to embodiments of the present invention.

FIG. 1 is a block diagram of clock groups communicating between two chips where the signals may use pseudo-differential signaling. A transmitting integrated circuit (IC) chip A 101 receives signals 109 and system clocks 108 and transmits them over module/card wiring 102 to receiving IC chip B 103. Signals 109 are partitioned into "clock groups" in that a separate clock signal pair (clock signal and its complement) is sent with each signal group. Clock group 0 comprises Data/Address/Control Signals 110 and clock Dclk (0) 111 and Dclk_(0) 112. Clock group 1 comprises Data/Address/Control Signals 113 and clock Dclk (1) 114 and Dclk_(1) 115 and Clock group N comprises Data/Address/Control Signals 116 and clock Dclk (N) 117 and Dclk_(N) 118. The signals and clocks in these groups are received in receivers (not shown) as Clock group 0 119-Clock group (N) 121 and are detected to generate received signals 122 and system clocks 123.

Figure 2:
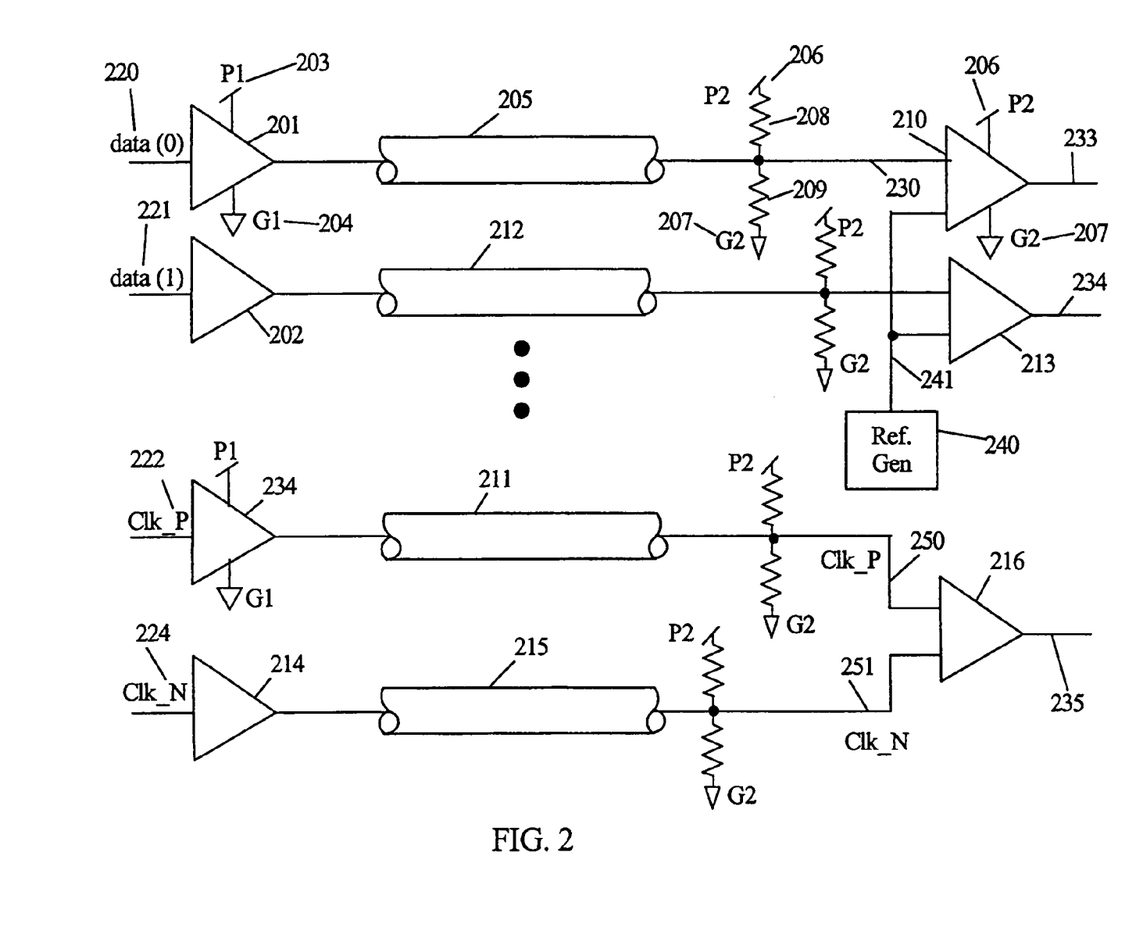
FIG. 2 is a circuit diagram of data and clock transmission paths suitable for practicing embodiments of the present invention.

FIG. 2 is a circuit diagram of typical pseudo-differential signaling suitable for practicing embodiments of the present invention where data is transmitted from a driver to a receiver (e.g., within a clock group (0) 105 in FIG. 1). Exemplary reference generator (RG) 240 is used to generate a single reference (e.g., Vref 241) for multiple receivers (e.g., 210 and 213) within a clock group (e.g., within a clock group (0) 105 in FIG. 1). Drivers 201 and 202 represent two of a number of N drivers sending data to receivers 210 and 213, respectively. Exemplary driver 201 receives data 0 220 and generates an output that swings between power supply rail voltages P1 203 (logic one) and G1 204 (logic zero). When the output of driver 201 is at P1 203, any noise on the power bus is coupled to transmission line 205 along with the logic state of the data signal. Exemplary transmission line 205 is terminated with a voltage divider comprising resistors 208 and 209. Exemplary receiver input 230 has a DC bias value determined by the voltage division ratio of resistors 208 and 209 and the voltage between P2 206 and G2 207. Exemplary receiver 210 is powered by voltages P2 206 and G2 207 which may have different values from P1 203 and G1 204 due to distribution losses, noise coupling, and dynamic impedance of the distribution network. Exemplary receiver 210 is typically a voltage comparator or high gain amplifier that amplifies the difference between a signal at input 230 and a reference voltage 241. In this circuitry, driver side noise will not be reduced by common mode rejection as the reference voltage (e.g., Vref 241) does not contain driver side noise but rather reflects noise of the receiver side. A clock signal Clk_P 222 and its complement Clk_N 224 are coupled to transmission lines (TL) 211 and TL 215 with drivers 234 and 214, respectively. The clock signals Clk_P 222 and Clk_N 224 are received as Clk_P 250 and Clk_N 251 in a differential receiver 216 that may employ duty cycle compensation circuitry according to embodiments of the present invention. Differential receiver circuitry 216 generates a single ended signal at output 235 which may then be buffered for distribution within an IC.

Figure 3:
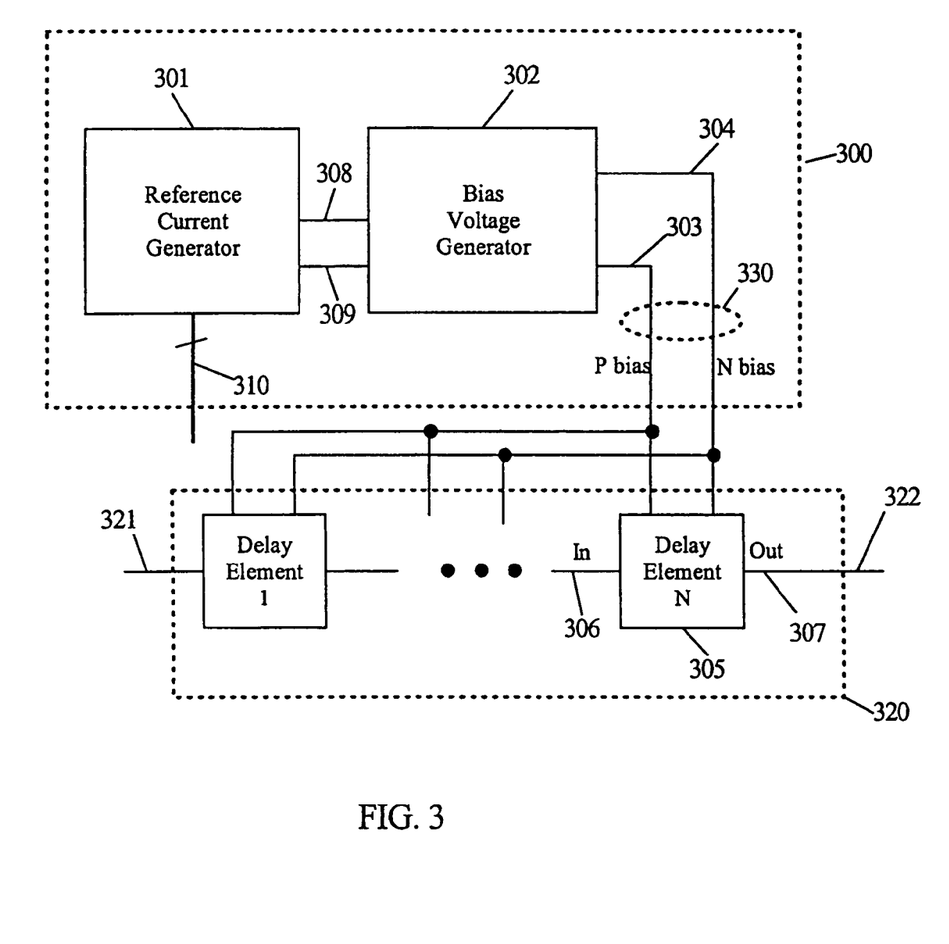
FIG. 3 is a block diagram of delay control of a delay element using a controlled current source and a bias generator according to embodiments of the present invention.

FIG. 3 is block diagram of bias control circuitry 300 used to control the delay of an exemplary delay element 305 in delay line 320. Delay line 320 comprises N delay stages between delay line input 321 and output 322. A reference current generator 301 is programmed with adjustment controls 310 to generate programmed bias voltages 308 and 309. Bias voltage generator receives the bias voltages 308 and 309 and generates variable P bias 303 for P-channel field effect transistors (PFETs) and N bias 304 for NFETs in delay element 305 in the delay elements (e.g., delay element 305. P bias 303 and N bias 304 are variable in response to adjustment controls 310.

Figure 4:
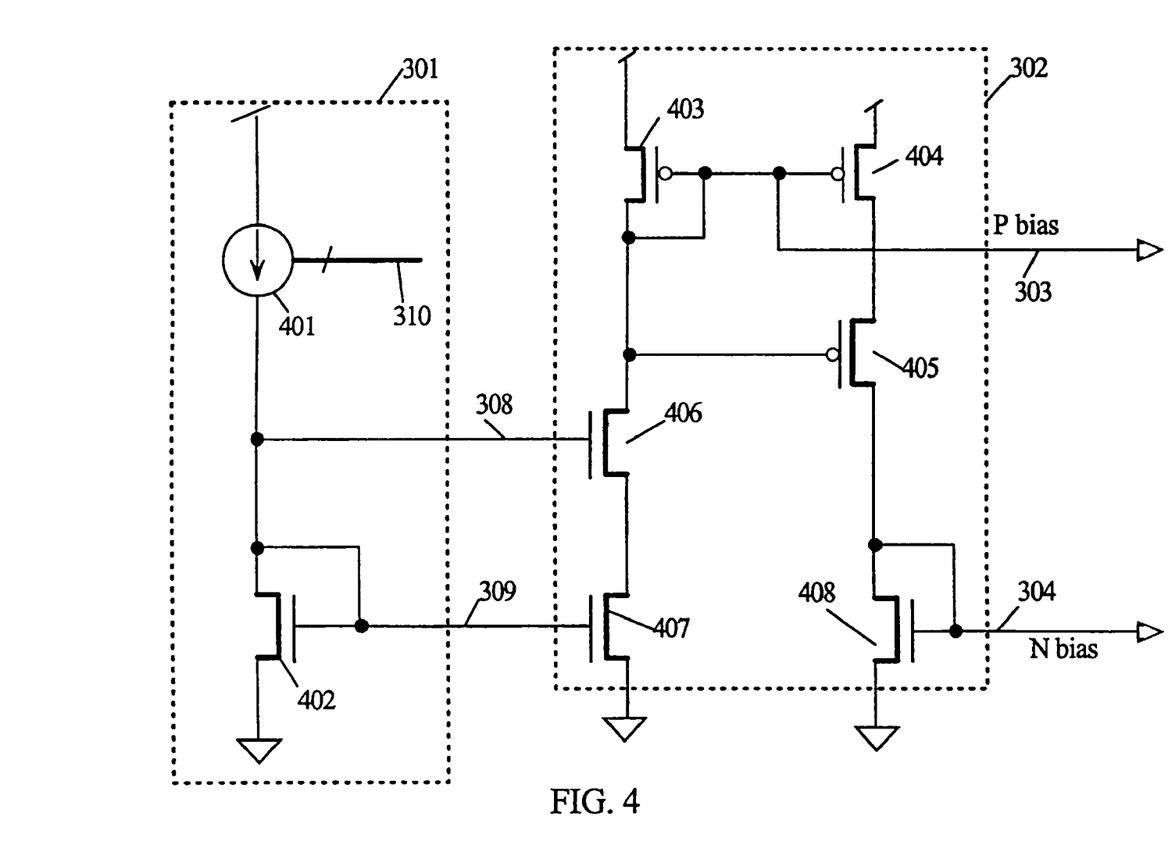
FIG. 4 is a circuit diagram of the current source and bias generator of FIG. 3.

FIG. 4 is a circuit diagram of reference current source 301 and bias voltage generator 302 shown in FIG. 3. NFET 402 is configured with its gate terminal coupled to its drain terminal such that the current from programmable current source 301 determines a particular gate-to-source voltage as bias voltage 309. Bias voltage 309 is coupled to the gate of NFET 407 and bias voltage 308 is coupled to the gate of NFET 406. In this circuit, NFETs 406 and 407 are low threshold voltage devices connected in a cascode configuration. The current in NFET 402 is mirrored to NFETs 406 and 407. NFETs 406 and 407 are current sources and force the mirrored current through PFET 403. PFET 403 also has its gate coupled to its drain to generate a gate-to-source voltage as a function of the mirror current. PFETs 404 and 405 mirror the current in PFET 403 and force it to flow in NFET 408. PFET 403 generates program voltage P bias 303 and NFET 304 generates program voltage N bias 304. Both of these program voltages vary when adjustment control signals 310 modulate the current in current source 401.

Figure 5:
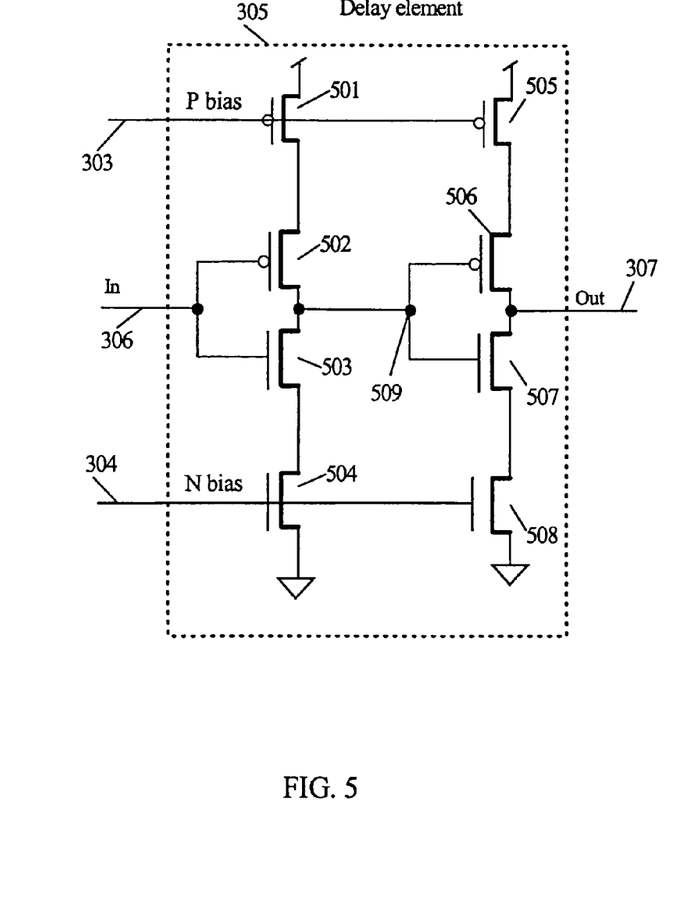
FIG. 5 is a circuit diagram of the delay element of FIG. 3.

FIG. 5 is a circuit diagram of delay element 305 suitable for practicing embodiments of the present invention. P bias 303 causes PFETs 501 and 505 to mirror the current used to generate P bias 303. Likewise, N bias 304 causes NFETs 504 and 508 to mirror the current used to generate N bias 304. Input 306 couples to the gates of PFET 502 and NFET 503 which are connected in an inverting stage configuration. When PFET 502 turns ON, the current mirrored to PFET 501 charges node 509. Likewise, when NFET 504 turns ON, the current mirrored to NFET 504 discharges node 509. The voltage on node 509 is coupled to the gates of PFET 506 and NFET 507 which are also connected in an inverting stage configuration. When PFET 506 turns ON, the current mirrored to PFET 505 charges output 307 of delay element 305. Likewise, when NFET 507 turns ON, the current mirrored to NFET 508 output 307 of delay element 305. The current level used to charge and discharge the nodes affects the delay of the logic stage transitions of delay element 305, thus forming a programmable delay element. Delay element 305 is non-inverting and provides a building block for configuring longer delay lines (e.g., DDL 501 in FIG. 5) used in embodiments of the present invention.

Figure 6:
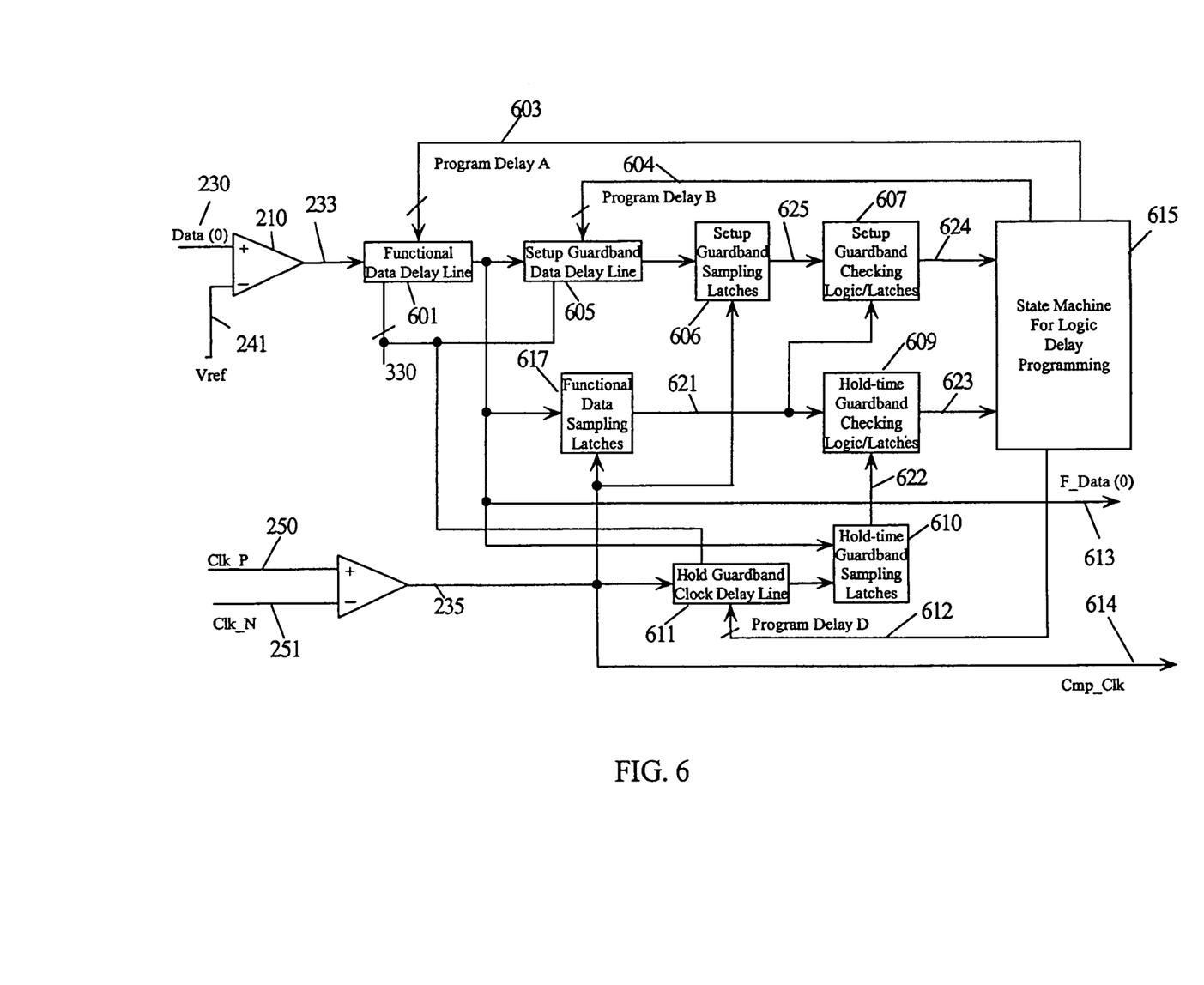
FIG. 6 is a block diagram of a data path using delay lines made with delay elements of FIG. 3.

FIG. 6 is a detailed block diagram of circuits used to maximize the data eye pattern in clock groups (e.g., clock group 119–121 in FIG. 1). An exemplary data signal Data (0) 230 (FIG. 2) is received in receiver 210 and detected with reference voltage Vref 241 (e.g., from FIG. 2). A detected data signal at output 233 is coupled to functional Data Delay Line (DDL) 601. DDL 601 generates functional data signal F_Data (0) 613 by delaying Data (0) 230 relative to the Cmp_Clk 614 to de-skew the data signal. The circuitry in Setup Delay Line (SDL) 605, Hold Clock Delay Line (CDL) 611 and circuit blocks 606, 607, 609 610 and 617 are used to determine the timing relation between F_Data (0) 613 and Cmp_Clk 614. State machine 615 receives signals 623 and 624 from blocks 607, 609 and programs the delays in DDL 601, SDL 605, and CDL 611 (using program signals 603, 604, and 612) to iteratively arrive at a maximum eye window size. Signal 625 is the Setup guardband sample, signal 621 is the Functional data sample, and signal 622 is the Hold guardband sample.

Bias control signals 330 are generated in response to program signals (e.g., 310 in FIG. 7) in another state machine when a calibration program indicates that the data delay lines are to be checked against the clock period (e.g., Cmp_Clk 614) to assure that the data delay lines (e.g., DDL 601) have adequate delay to de-skew the data paths corresponding to the clock groups (e.g., 119–121 in FIG. 1).

Figure 7:
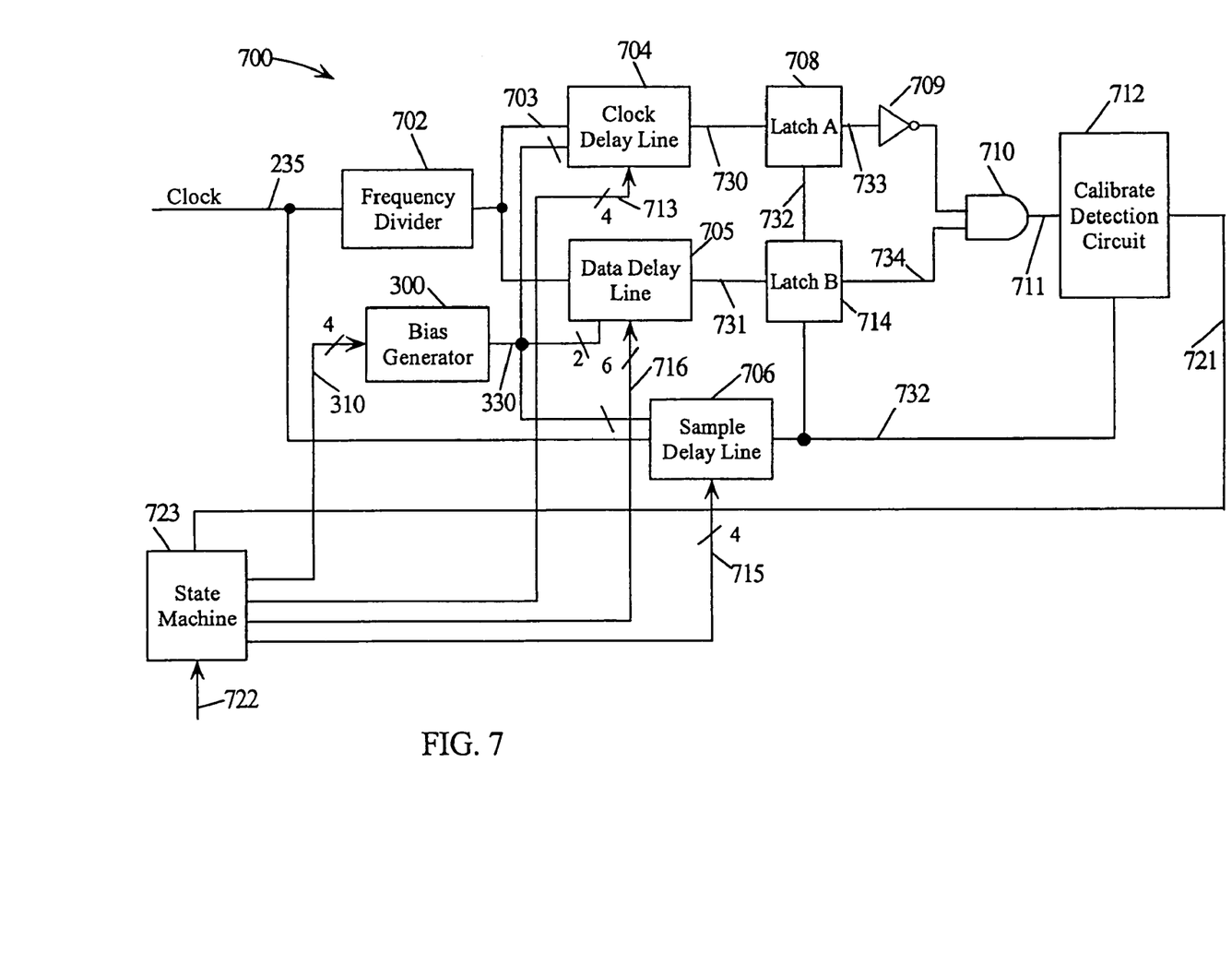
FIG. 7 is a block diagram of circuitry for adjusting the delay of delay lines according to embodiments of the present invention.

FIG. 7 is a block diagram of circuitry used to adjust and calibrate the delay values of delay elements (e.g., delay element 305 in FIG. 5) in the delay lines (e.g. DDL 601) using delay control signals 310 for a bias generator 300. Delay control signals A 310 modify bias generator 300 which in turn generates the appropriate bias voltages P bias 303 and N bias 304 to calibrate DDL 705. The values for delay control signals 310, determined using circuitry 700, are used to program the delay values for all the DDL lines (e.g., DDL 601) in one or more clock groups (e.g., clock groups 119–121 in FIG. 1).

Exemplary clock 235 is used to adjust and calibrate the delay line elements (e.g., delay element 305 is FIG. 3). Any system clock may be used since only the clock period is important in this process. Clock 235 is frequency divided by two in circuit 702 to generate a Clk_toggle 703 which is coupled to clock delay line (CDL) 704 and a DDL 705. DDL 705 receives delay adjust (DA) control signals 330 and delay program signals 716. CDL 704 receives delay adjust (DA) control signals 330 and delay program signals 713. Delay program signals 716 select the number of delay taps or stages for DDL 705 and DA control signals 330 determine the delay value for each tap or stage. Clock 235 is coupled to sample delay line (SDL) 706 which delays the clock and generates sample (S)_clk 732. SDL 706 receives delay adjust (DA) control signals 330 and delay program signals 715. Appropriate insertion delays (not shown) are added into each path so that the three clock signals, Clk_toggle 730, Dly_Clk_toggle 731 and S_clk 732 are substantially aligned when the delays in the path are set to their initial values. S_clk 732 is used to clock latches LA 708 and LB 714 generating output signals 733 and 734. Output signals 733 and 734 are combined in inverter 709 and AND gate 710 to generate calibrate signal 711. Circuit 712 generates calibrate signal 711 with a logic zero when Clk_toggle 730 and Dly_Clk_toggle 731 are in phase and a logic one when they are 180 degrees out of phase.

State Machine 723 is used to generate control signals 310, 713, 715, and 716 in response to a command 722 (to measure and adjust the delay line stage values) and Calibrate pattern signal 721. Initially, DDL 705 is set to zero delay and CDL 704 is offset a small amount (8 steps). Since Clk_toggle 730 and Dly_Clk_toggle 731 are initially in phase, the small delay added to CDL 704 assures an initial time, when sampling near their logic state transitions, that they have opposite logic states on successive samples. S_clk is delayed a small amount until the initial one/zero pattern on calibrate signal 711 is detected in calibrate detection circuit 712 and Calibrate pattern signal 721 transitions to a logic one. This sets the initial point for adjusting delay.

DDL 705 is then incremented with Delay program signals 716 and Calibrate pattern signal 721 transitions to a logic zero. Incrementing DDL 705 is continued until Calibrate pattern signal 721 again transitions to a logic one indicating that successive samples of Clk_toggle 730 and Dly_Clk_toggle 731 are 180 degrees out of phase or Dly_Clk_toggle 731 has been shifted by delay line DDL 705 by 2 bit periods (bit samples occur on each clock transition) of Clk 235. The value represented by the states of Delay program signals 716 indicates how many taps or stages of DDL 705 correspond to the cycle period (2 bit periods) of Clk 235. If this value is not within a predetermined desired range, then State Machine 723 modifies delay adjust control signals 310 to modify the stage delay in the delay elements of DDL 705, CDL 704, and SDL 706. The calibration is repeated to determine if the new program values for the delay elements generates the desired delay range for DDL 705. The control signals 310 are then latched and bias voltages 330 are coupled to the delay lines in one or more clock groups (e.g., clock groups 119–121 in FIG. 1). It is understood that clock 235 could be divided by any even integer number in frequency divider 702 and still be within the scope of the present invention. In this case, adjusting the delay lines would require delays of multiple periods of the clock signal before Calibrate pattern signal 721 transitioned to the second logic one.

Figure 8:
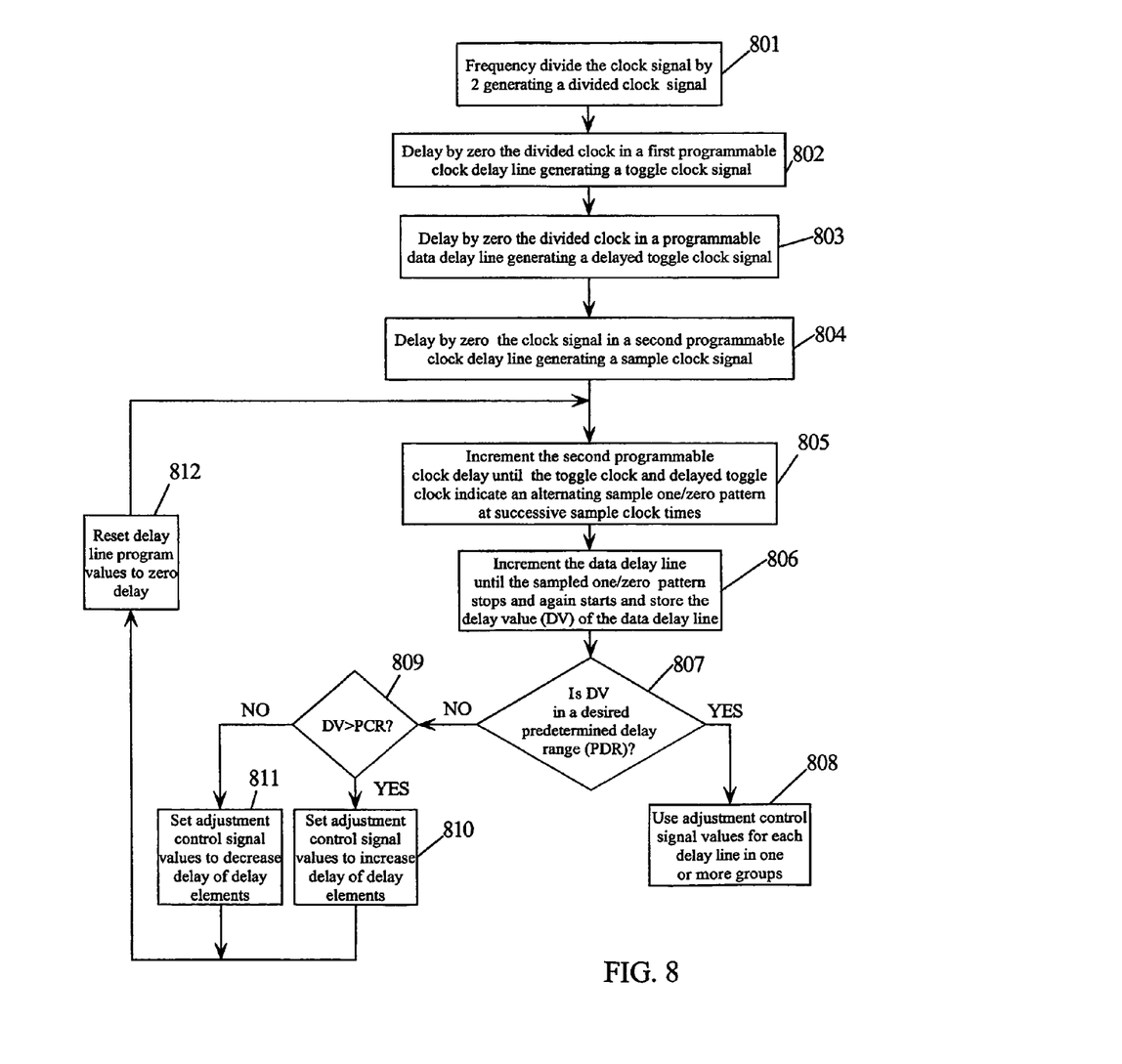
FIG. 8 is a flow diagram of method steps used in embodiments of the present invention.

FIG. 8 is a flow diagram of method steps which may be implemented in state machine 723 (FIG. 7) to adjust and calibrate delay lines according to embodiments of the present invention. In step 801, a sample clock is frequency divided by two generating a divided clock. In step 801, the divided clock is delayed by zero delay in a first programmable clock delay line generating a toggle clock. In step 803, the divided clock is delayed by zero delay by selecting stages in a programmable data delay line wherein each stage is a voltage variable delay element thereby generating a delayed toggle clock. The delayed toggle clock may now undergo the same delay steps that a data path may undergo during a de-skew operation. In step 804, the sample clock is delayed by zero delay in a second programmable clock delay line generating a delayed sample clock. At this point, the toggle clock and the delayed toggle clock are in phase when sampled by the delayed sample clock. In step 805, first clock delay is incremented a small amount until the delayed sample clock samples the toggle clock and the delayed toggle clock indicating an alternating one/zero pattern. In step 806 the programmable data delay is incremented until the alternating one/zero pattern stops and again start and the data delay value of the programmable data delay is stored as the number of delay taps corresponding to 2 bit periods (sampling occurs on both clock edges) of the sample clock or one frequency period. In step 807, a test is done to determine if the data delay value (DV) is in a desired predetermined delay range (PDR). If the result of the test in step 807 is YES, then in step 808 adjustment control signals setting the delay of each delay stage in the data delay lines are used to program the data delays in one or more clock group (e.g., clock group 119–121 in FIG. 1). If the result of the test in step 807 is NO, then in step 809 a test is done to determine if DV is greater than PDR. If the result of the test in step 809 is YES, then DV is too large and in step 810 adjustment control signals are used to increase the amount of delay in each delay element used to configure the data delay lines. In this case, there are too many delay stages required to span a sampling clock period. If the result of the test in step 809 is NO, then DV is too small and in step 811 the adjustment control signals are used to decrease the amount of delay in each delay element used to configure the data delay lines. In this case, there are too few delay stages required to span a sampling clock period. In step 812, the program delay values for the programmable data and the first and second programmable clock delay lines are set to zero and a branch is taken back to step 805. The process is continued until step 808 is reached.

Figure 9:
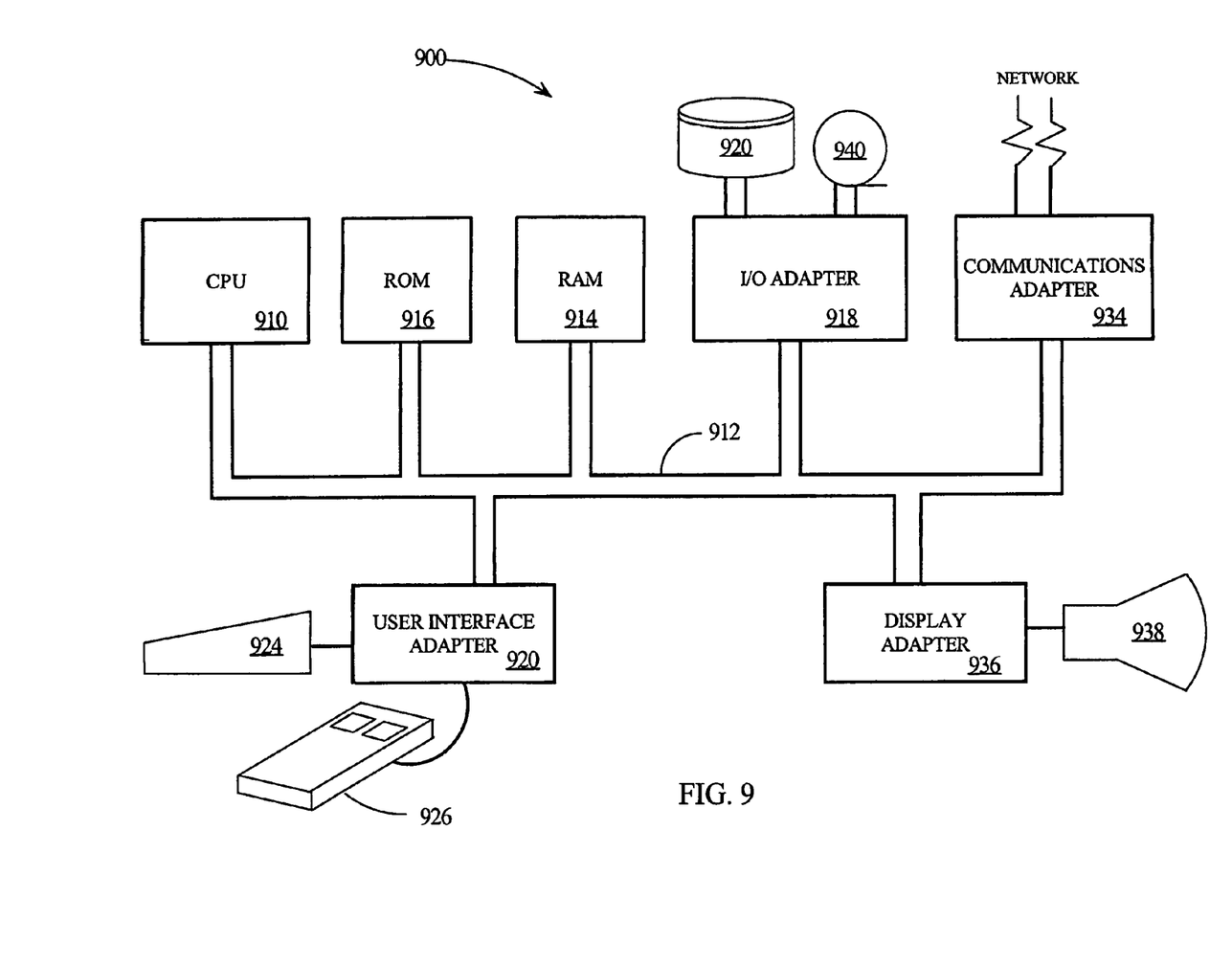
FIG. 9 is a data processing system suitable for practicing embodiments of the present system.

FIG. 9 is a high level functional block diagram of a representative data processing system 900 suitable for practicing the principles of the present invention. Data processing system 900 includes a central processing system (CPU) 910 operating in conjunction with a system bus 912. System bus 912 operates in accordance with a standard bus protocol, such as the ISA protocol, compatible with CPU 910. CPU 910 operates in conjunction with electronically erasable programmable read-only memory (EEPROM) 916 and random access memory (RAM) 914. Among other things, EEPROM 916 supports storage of the Basic Input Output System (BIOS) data and recovery code. RAM 914 includes, DRAM (Dynamic Random Access Memory) system memory and SRAM (Static Random Access Memory) external cache. I/O Adapter 918 allows for an interconnection between the devices on system bus 912 and external peripherals, such as mass storage devices (e.g., a hard drive, floppy drive or CD/ROM drive), or a printer 940. A peripheral device 920 is, for example, coupled to a peripheral control interface (PCI) bus, and I/O adapter 918 therefore may be a PCI bus bridge. User interface adapter 922 couples various user input devices, such as a keyboard 924 or mouse 926 to the processing devices on bus 912. Display 938 which may be, for example, a cathode ray tube (CRT), liquid crystal display (LCD) or similar conventional display units. Display adapter 936 may include, among other things, a conventional display controller and frame buffer memory. Data processing system 900 may be selectively coupled to a computer or telecommunications network 941 through communications adapter 934. Communications adapter 934 may include, for example, a modem for connection to a telecom network and/or hardware and software for connecting to a computer network such as a local area network (LAN) or a wide area network (WAN). CPU 910 and other components of data processing system 900 may contain logic circuitry in two or more integrated circuit chips that are separated by a significant distance relative to their communication frequency such that pseudo-differential signaling employing embodiments of the present invention is used to reduce clock asymmetry and maximize the eye window of data signals according to embodiments of the present invention.

Although the present invention and its advantages have been described in detail, it should be understood that various changes, substitutions and alterations can be made herein without departing from the spirit and scope of the invention as defined by the appended claims.

What is claimed is:

1. A method of calibrating a programmable delay line having a plurality of variable delay stages each with a delay set in response to delay adjust signals, comprising the steps of:
   a) delaying a divided clock signal with a programmable clock delay line by selecting a number K of the variable delay stages in the programmable clock delay line in response to first delay programming signals, thereby generating a toggle clock signal, wherein the divided clock signal is generated by frequency dividing the clock signal by two;
   b) delaying the divided clock signal with a programmable data delay line by selecting a number N of the variable delay stages in the programmable data delay line in response to second delay programming signals, thereby generating a delayed toggle clock signal;
   c) delaying the clock signal with a programmable sample delay line by selecting a number P of the variable delay stages in the programmable sample delay line in response to third delay programming signals, thereby generating a sample clock signal;
   d) setting the numbers K, N, and P to their initial values to equalize initial delays of the programmable clock delay line, the programmable data delay line, and the programmable sample delay line;

e) sampling the toggle clock signal and the delayed toggle clock signal with the sample clock signal in a latch circuit and generating a calibrate signal as a logic combination of the toggle clock signal and the delayed toggle clock signal when sampled; and f) calibrating the programmable delay line in response to the calibrate signal.

2. The method of claim 1, wherein step f) calibrating the programmable delay line comprises the steps of:

f) modifying an initial delay of the sample delay line by offsetting the number P with the third delay programming signals until the calibrate signal initially alternates between a logic one and a logic zero on successive samples by the sample clock and generating a calibrate pattern signal that transitions to a first logic one when the calibrate signal alternates between a logic one and a logic zero;

g) adjusting a delay of the programmable data delay line by incrementing the number N in response to the second delay programming signals until the calibrate pattern signal transitions to a logic zero and then to a second logic one, wherein a final value of N generating the second logic one of the calibrate pattern signal corresponds to a number of variable delay stages in the programmable data delay line having a delay time substantially equal to a period of the clock signal; and h) incrementing the delay adjust control signals to modify the delay of each of the variable delay stages, and repeating steps a) through g) if the final value of N falls outside a predetermined desired range number R.

3. The method of claim 1, wherein each of the variable delay stages comprises a complementary logic stage having an input, an output, a programmable first current source for charging the output with a first current to a logic one state in response to a logic zero state of the input, and a programmable second current source for discharging the output with a second current to a logic zero state in response to a logic one state of the input.

4. The method of claim 3, wherein values of first and second currents of the programmable first and second current sources are set in response to voltage levels of first and second bias voltages.

5. The method of claim 4, wherein the first and second bias voltages are generated in a bias generator in response to the adjustment control signals.

6. The method of claim 3, wherein the programmable first current source comprises a P-channel field effect transistor (PFET) with the first current set by a corresponding PFET current mirror device and a NFET with the second current set by a corresponding NFET current mirror device.

7. The method of claim 6, wherein the first current is established in the PFET current mirror device and the second current is established in the NFET mirror device by programming a reference current source with the adjustment control signals, thereby assuring that the first and second currents are substantially equal.

8. The method of claim 1, wherein the latch circuit comprises:

a first latch having an input coupled to the toggle clock signal and an output generating the sampled logic state of the toggle clock signal on a first logic transition of the sample clock signal;

a second latch having an input coupled to the delayed toggle clock signal and an output generating the sampled logic state of the delayed toggle clock signal on the first logic transition of the sample clock signal; and a logic gate having a first input coupled to the output of the first latch and a second input coupled to the output of the second latch and an output generating calibrate signal as the logic combination of the toggle clock signal and the delayed toggle clock signal.

9. The method of claim 8, wherein the logic gate comprises:

a logic AND gate having a first input coupled to the delayed toggle clock signal, a second input and an output generating the calibrate signal; and an inverting stage having an input coupled to the toggle clock signal and an output coupled to the second input of the logic AND gate.

10. The method of claim 9, wherein the calibrate pattern signal is generated in a calibrate detection circuit comprising:

a sampling latch having an input coupled to the calibrate signal, a clock input coupled to the sample clock signal, and an output, wherein the sampling latch stores a sample logic state of the calibrate signal when the sample clock signal transitions to a logic one and transfer the sample logic state to the output of the sampling latch when the sample clock signal transitions to a logic zero; and an exclusive OR logic gate having a first input coupled to the calibrate signal, a second input coupled to the output of the sampling latch and an output generating the calibrate pattern signal.

11. A system for calibrating a programmable delay line having a plurality of variable delay stages each with a delay set in response to delay adjust signals, wherein the programmable delay line is used to align data signals with a clock signal for optimally sampling the data signals at the middle of the data signal eye pattern window, comprising:

a dividing circuit for frequency dividing the clock signal by two thereby generating a divided clock signal;

a programmable clock delay line for delaying the divided clock signal by selecting a number K variable delay stages in the programmable clock delay line in response to first delay programming signals thereby generating a toggle clock signal;

a programmable data delay line for delaying the divided clock signal by selecting a number N variable delay stages in the programmable data delay line in response to second delay programming signals thereby generating a delayed toggle clock signal;

a programmable sample delay for delaying the clock signal by selecting a number P variable delay stages in the programmable sample delay line in response to third delay programming signals thereby generating a sample clock signal;

a latch circuit for concurrently sampling the toggle clock signal and the delayed toggle clock signal with the sample clock signal and generating a calibrate signal as a logic combination of sampled logic states of the toggle clock signal and the delayed toggle clock signal, wherein the calibrate signal is a logic one when the toggle clock signal is a logic zero state and the delayed toggle clock signal is the logic one;

a calibrate detection circuit generating a calibrate pattern signal this is a logic one state when the calibrate signal alternates between the logic one and logic zero states on successive samples by the sample clock signal;

a control circuit for generating the first, second, third programming control signals in response to a calibrate delay line signal, range signals setting a predetermined range number R, and the calibrate pattern signal, wherein the control circuit adjusts the values of K, P, and N such that the calibrate pattern signal starts at an initial logic one state, increments N until the calibrate pattern signal transitions to a second logic state and back to a second logic one state, and wherein a final value N, generating the second logic one state of the calibrated pattern signal, is within the predetermined range number R and a delay adjust circuit incrementing the delay adjust control signals in response to a comparison of the final value N to the predetermined range number R, wherein the delay adjust control signals modify a delay of each of the variable delay stages until the final value N falls within the predetermined range number R.

12. The system of claim 11, wherein the latch circuit comprises:

a first latch having an input coupled to the toggle clock signal and an output generating the sampled logic state of the toggle clock signal on a first logic transition of the sample clock signal;

a second latch having an input coupled to the delayed toggle clock signal and an output generating the sampled logic state of the delayed toggle clock signal on the first logic transition of the sample clock signal; and a logic gate having a first input coupled to the output of the first latch and a second input coupled to the output of the second latch and an output generating the logic combination of the calibrate signal.

13. The system of claim 12, wherein the logic gate comprises:

a logic AND gate having a first input coupled to the delayed toggle clock signal, a second input and an output generating the calibrate signal; and an inverting stage having an input coupled to the toggle clock signal and an output coupled to the second input of the logic AND gate.

14. The system of claim 13, wherein the calibrate detection circuit comprises:

a sampling latch having an input coupled to the calibrate signal, a clock input coupled to the sample clock signal, and an output, wherein the sampling latch stores a sample logic state of the calibrate signal when the sample clock signal transitions to a logic one and transfer the sample logic state to the output of the sampling latch when the sample clock signal transitions to a logic zero; and an exclusive OR logic gate having a first input coupled to the calibrate signal, a second input coupled to the output of the sampling latch and an output generating the calibrate pattern signal.

15. The system of claim 11, wherein the data delay line comprises multiple delay lines in series to assure enough range occurs before incrementing the adjust control signals to change the delay of a delay element.

16. The system of claim 11, wherein each of the variable delay stages comprises a complementary logic stage having an input, an output, a programmable first current source for charging the output with a first current to a logic one state in response to a logic zero state of the input, and a programmable second current source for discharging the output with a second current to a logic zero state in response to a logic one state of the input.

17. The system of claim 16, wherein values of first and second currents of the programmable first and second current sources are set in response to voltage levels of first and second bias voltages.

18. The system of claim 17, wherein the first and second bias voltages are generated in a bias generator in response to the adjustment control signals.

19. The system of claim 18, wherein the programmable first current source comprises a P-channel field effect transistor (PFET) with the first current set by a corresponding PFET current mirror device and a NFET with the second current set by a corresponding NFET current mirror device.

20. The system of claim 19, wherein the first current is established in the PFET current mirror device and the second current is established in the NFET mirror device by programming a reference current source with the adjustment control signals, thereby assuring that the first and second currents are substantially equal.

* * * * *